United States Patent
Oita et al.

(10) Patent No.: US 7,019,596 B2
(45) Date of Patent: Mar. 28, 2006

(54) MULTIPLE OUTPUT HIGH-FREQUENCY OSCILLATOR

(75) Inventors: Takeo Oita, Saitama (JP); Yuichi Sato, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 10/101,008

(22) Filed: Mar. 19, 2002

(65) Prior Publication Data

US 2002/0135430 A1    Sep. 26, 2002

(30) Foreign Application Priority Data

Mar. 22, 2001   (JP)   ............... 2001-082578

(51) Int. Cl.
   *H03B 1/00*   (2006.01)
(52) U.S. Cl. ........................................ 331/74
(58) Field of Classification Search ............... 331/60, 331/61, 74, 76, 77–78, 75, 116 R, 158, 177 R
   See application file for complete search history.

(56) References Cited

U.S. PATENT DOCUMENTS 3,531,722 A     9/1970   Seibold ............... 455/115.1

(Continued)

FOREIGN PATENT DOCUMENTS

| EP | 645 885 | 3/1995 |
| GB | 2 302 625 | 1/1997 |
| JP | U-64-38813 | 3/1989 |

OTHER PUBLICATIONS

"Saw Filters—Product Selection Guide"; *NDK America Products Guide*; Oct. 19, 2000; pp. 1-3; retrieved from the Internet: URL:http://web.archive.org/web/20001019015219/http://www.ndk.com/products/guide.htm.

(Continued)

*Primary Examiner*—Minh Nguyen
(74) *Attorney, Agent, or Firm*—Greer, Burns & Crain, Ltd.

(57) ABSTRACT

A high-frequency oscillator that enables a plurality of frequency signals to be output. The high-frequency oscillator outputs in parallel a plurality of frequency components from within a frequency spectrum of an oscillation output of a crystal oscillator, selects one or a plurality of frequency components from among the plurality of frequency components, and outputs the selected components as high-frequency outputs. In this way, a plurality of high-frequency signals can be obtained from one crystal oscillator.

13 Claims, 5 Drawing Sheets

U.S. PATENT DOCUMENTS

| | | | | | |
|---|---|---|---|---|---|
| 3,713,155 | A | * | 1/1973 | Jaffe | 342/92 |
| 4,105,949 | A | | 8/1978 | Hardin | 331/37 |
| 4,134,085 | A | | 1/1979 | Driscoll et al. | 331/116 R |
| 4,689,570 | A | * | 8/1987 | Ohgaki et al. | 324/418 |
| 5,263,197 | A | | 11/1993 | Manjo et al. | 455/324 |
| 5,510,922 | A | * | 4/1996 | Naito | 359/124 |
| 5,555,453 | A | * | 9/1996 | Kajimoto et al. | 455/266 |
| 5,712,596 | A | * | 1/1998 | Van Amesfoort | 331/76 |
| 6,549,083 | B1 | | 4/2003 | Kanazawa et al. | 331/76 |

OTHER PUBLICATIONS

"Crystal Filters—MCF: 45MHz Overtone"; *NDK America Products Guide*; Oct. 19, 2000; pp. 1-2; retrieved from the Internet: URL:http://web.archive.org/web/2000101901-5219/http://www.ndk.com/products/cfmcf3.ht.

"Saw Filters—71 & 400 MHz"; *NDK America Products Guide*; Oct. 19, 2000; p. 1; retrieved from the Internet: URL:http://web.archive.org/web/20001019015219/http://www.ndk.com/products/saw1.htm.

* cited by examiner

MULTIPLE OUTPUT HIGH-FREQUENCY OSCILLATOR

BACKGROUND OF THE INVENTION

1. Field of the Invention

The present invention relates to a high-frequency oscillator, and more particularly, to a high-frequency oscillator switching and outputting signals of a plurality of frequencies.

2. Description of the Related Art

A high-frequency oscillator that outputs a 100-MHz or higher frequency by using a crystal resonator with high stability is used as a frequency source, etc. of an optical communication. The high-frequency oscillator normally amplifies the output of a crystal oscillator with frequency multiplication, for example, by using a plurality of LC filter stages and an amplifier, and obtains a target high-frequency output.

In recent years, instead of this configuration, a high-frequency oscillator having a configuration where a high-frequency output is obtained by distorting the output of a crystal oscillator, and by selecting a harmonic component with a SAW (Surface Acoustic Wave) filter has been implemented, for example, as recited in Japanese Patent Application No. 2000-244682. With this configuration, the number of elements is decreased, so that the outer dimensions of the oscillator are significantly reduced.

FIG. 1 is a circuit diagram of the high-frequency oscillator having the above described configuration.

The high-frequency oscillator shown in this figure is configured by a crystal oscillator 1, an SAW (Surface Acoustic Wave) filter 2, and an amplifier 3. The crystal oscillator 1 is composed of a crystal resonator 4 which is, for example, AT-cut, a split capacitor which is not shown and forms a resonant circuit along with the crystal resonator 4, and an oscillation amplifier 5 which feeds back and amplifies a resonant frequency. Here, what is called an oscillation circuit of a colpitts type is formed.

The SAW filter 2 is configured by forming, for example, input/output interdigital transducers (IDTs) on a piezoelectric substrate not shown. The SAW filter 2 makes only a component in a particular frequency region of an input signal pass through, and outputs the component.

The amplifier 3 is implemented as a broadband amplifier 3 such as a linear IC amplifier, etc. With the amplifier 3, the output of the SAW filter 2 is amplified with a linear portion, that is, a non-saturation portion of the input/output characteristic of the broadband amplifier 3 so that a high-frequency output is obtained.

The crystal oscillator 1 referred to here is a voltage control type implemented by inserting a voltage variable capacitance element 6 in an oscillation closed loop of the crystal oscillator 1. The oscillation frequency of the crystal oscillator 1 is varied by a control voltage Vc that is applied via a high-frequency blocking resistor 7. Additionally, Vcc in FIG. 1 is a power source voltage.

In the high-frequency oscillator shown in FIG. 1, the oscillation output of the crystal oscillator 1 is distorted. For example, the top of a sinusoidal wave is cut and distorted to be rectangular as shown in FIG. 2 by making a center voltage Voo of the oscillation output higher than a center voltage Vco of the power souce voltage Vcc. The oscillation output of the crystal oscillator 1 is distorted, so that the levels of harmonic components f2 through fn, relative to a fundamental component f1 within a frequency spectrum, are raised in the oscillation output as shown in FIG. 3.

The respective components of the frequency spectrum are made equal to or higher than a predetermined level as shown in FIG. 3, whereby an arbitrary harmonic component can be selected by inputting this oscillation output to the SAW filter 2. For example, the fundamental frequency (fundamental component) f1 of the crystal oscillator 1 is implemented to be 155.52 MHz, which is almost as high as the manufacturing limit, and a harmonic component 622.08 MHz, which becomes a quadruple-frequency wave f4, is selected with the SAW filter 2, and amplified with the amplifier 3, so that a high-frequency output is obtained. If the oscillation output of the crystal oscillator 1 is not distorted, the level of a harmonic component relative to the fundamental component is low. Therefore, the harmonic component cannot be selected with the SAW filter 2.

However, with the high-frequency oscillator having the above described configuration, only a signal of one high frequency, for example, only a signal of 622.08 MHz can be supplied. Accordingly, if a communications appliance requires signals of 2 frequencies such as the fundamental frequency (155.52 MHz), and the harmonic frequency being a quadruple-frequency wave (622.08 MHz), 2 high-frequency oscillators are mounted on a set substrate, and an output signal from either of the oscillators is selected. Therefore, the configuration of the high-frequency oscillator becomes large in this case, leading to an increase in the cost, and an obstacle to the downsizing of the set substrate.

SUMMARY OF THE INVENTION

An object of the present invention is to provide a high-frequency oscillator of a frequency selection type, which can select and output one or more frequencies from a plurality of high frequencies.

The high-frequency oscillator according to the present invention comprises a unit outputting in parallel a plurality of frequency components within a frequency spectrum which includes a fundamental component and a harmonic component of the oscillation output from a crystal oscillator, and a multiplexer unit selecting one or more frequency components from the plurality of frequency components.

The high-frequency oscillator according to the present invention, which has a second configuration, comprises a crystal oscillation unit, a first filter unit, a second filter unit, and a multiplexer unit.

The crystal oscillation unit distorts and outputs an oscillation output.

The first filter unit makes a first component, which becomes one of the frequency components of the frequency spectrum of the oscillation output, pass through.

The second filter unit makes a second component, which becomes one of the frequency components of the frequency spectrum of the oscillation output, pass through.

The multiplexer unit selects a signal that passes through either of the first and the second filter units.

The high-frequency oscillator according to the present invention, which has a third configuration, comprises the crystal oscillation unit, a plurality of filter units each making one of the frequency components of the frequency spectrum of an oscillation output pass through, and a multiplexer unit selecting and outputting one or more frequency components from among the frequency components which are made to pass through by the plurality of filter units.

With the high-frequency oscillator according to the present invention, a plurality of frequency components of the oscillation output of a crystal oscillator are output in parallel, and one or more frequency components are selected and output from among the plurality of frequency components, whereby a signal of an arbitrary frequency can be selected and output from among the plurality of frequency signals.

DESCRIPTION OF THE PREFERRED EMBODIMENTS

With the high-frequency oscillator according to the present invention, a plurality of frequency components are output in parallel from a frequency spectrum, which includes a fundamental component and a harmonic component, of an oscillation output of a crystal oscillator, and one of the plurality of frequency components is selected to obtain a high-frequency output. In this way, oscillation outputs of a plurality of high frequencies can be obtained with one crystal oscillator.

Figure 4:
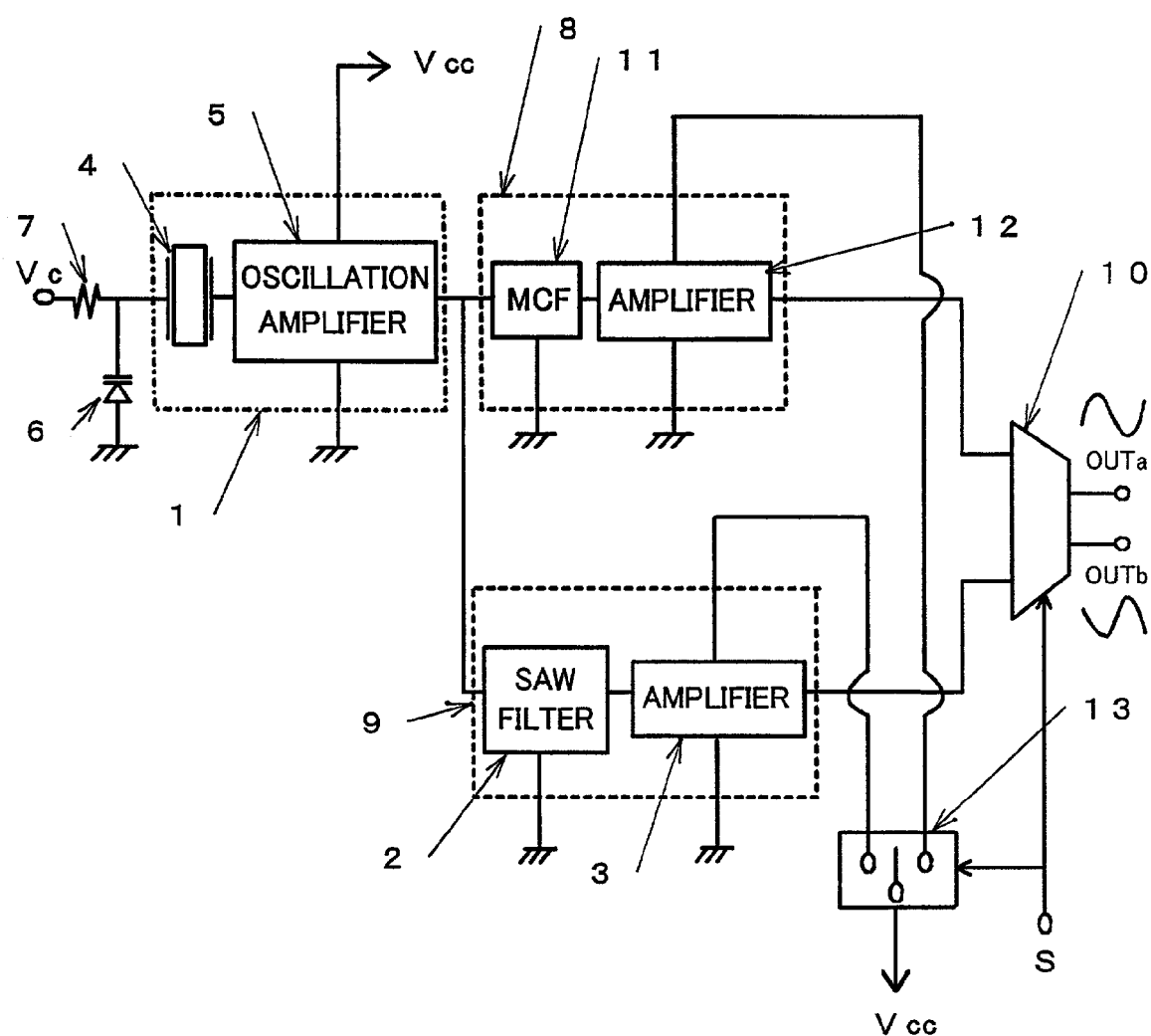
FIG. 4 is a circuit diagram exemplifying the configuration of a high-frequency oscillator according to a preferred embodiment.

FIG. 4 is a circuit diagram of the configuration of an high-frequency oscillator of a frequency selection type according to one preferred embodiment of the present invention.

Figure 1:
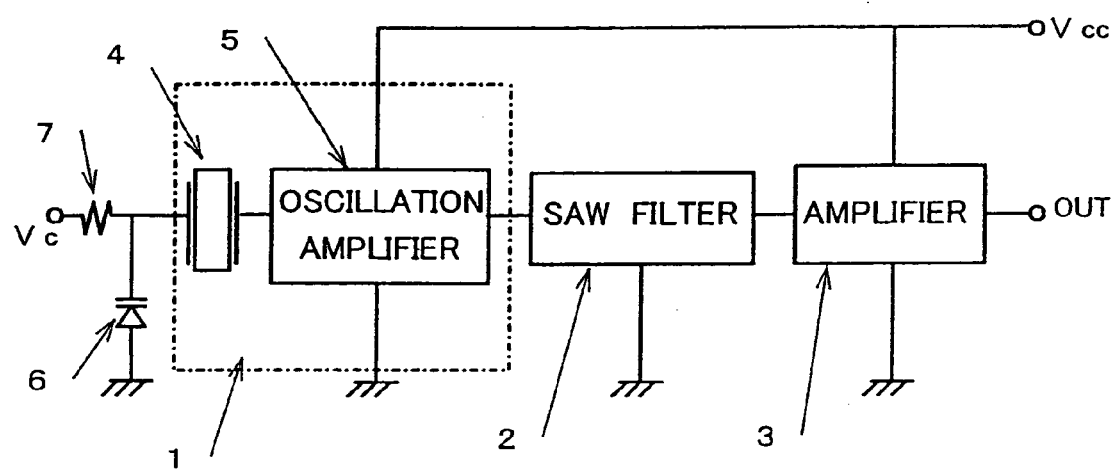
FIG. 1 is a circuit diagram showing the configuration of a high-frequency oscillator that obtains a high frequency output by distorting the output of a crystal oscillator, and by selecting a harmonic component with a SAW filter.

The high-frequency oscillator shown in this figure is an example in which the present invention is applied to the configuration of the high-frequency oscillator shown in FIG. 1. This oscillator is configured to output signals of 2 different frequencies. In this figure, the same constituent elements as those shown in FIG. 1 are fundamentally denoted with the same reference numerals, and their explanations are simplified or omitted below.

In the high-frequency oscillator shown in FIG. 4, 2 frequency components are output by a first selecting/amplifying unit 8 and a second selecting/amplifying unit 9 in parallel from the frequency spectrum of the oscillation output of a crystal oscillator 1, and either of the frequency components is selected and output by a multiplexer 10. In this way, a signal of an arbitrary frequency among the 2 frequencies can be selected and output.

Figure 2:
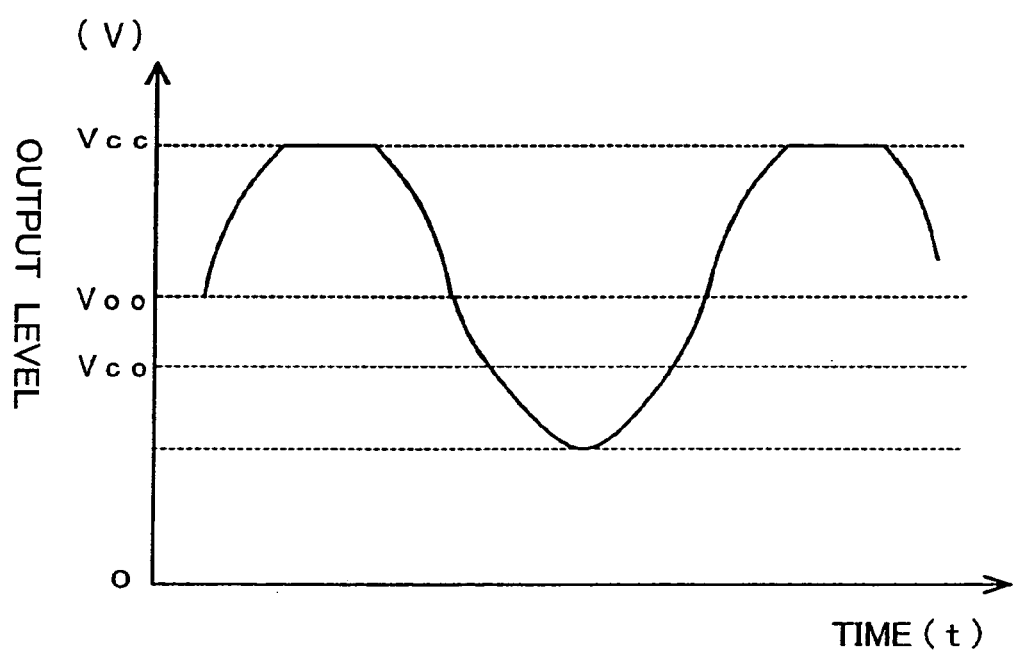
FIG. 2 shows the waveform of the oscillation output of the crystal oscillator.
Figure 3:
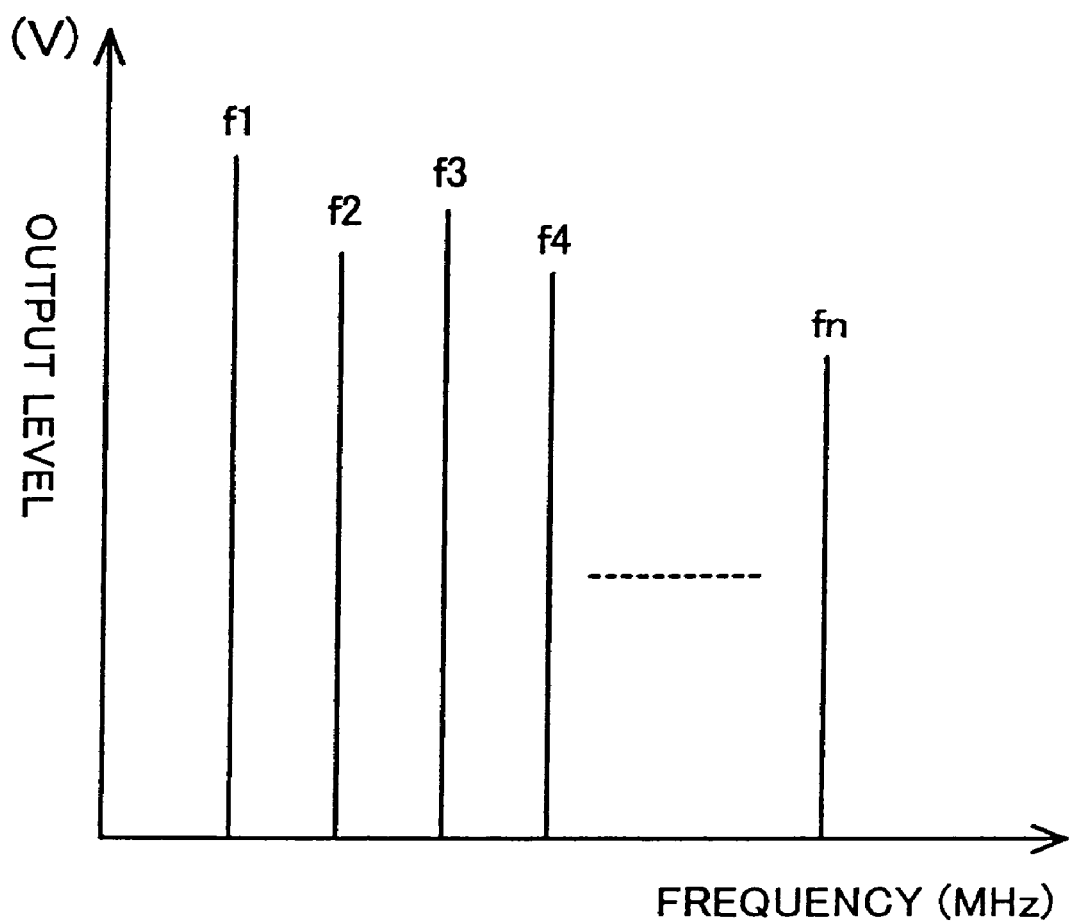
FIG. 3 shows the frequency spectrum of the oscillation output.

The high-frequency oscillator shown in FIG. 4 is configured by the crystal oscillator 1, the first selecting/amplifying unit 8, the second selecting/amplifying unit 9, and the multiplexer 10. Similar to the crystal oscillator 1 shown in FIG. 1, the crystal oscillator 1 is composed of a crystal resonator 4, a split capacitor, and an oscillation amplifier 5. In this crystal oscillator 1, for example, a center voltage Voo is made higher than a central voltage Vco of a power supply voltage Vcc, so that the top of the sinusoidal wave of the oscillation output is cut and distorted to be rectangular as shown in FIG. 2. Or, for example, the top and the bottom of the sinusoidal wave may be distorted to be rectangular by increasing the amplification rate of the oscillation amplifier 5. As a result, the output from the crystal oscillator 1 has a frequency spectrum in which harmonic components f2 through fn, whose levels relative to a fundamental component f1 of the crystal oscillator 1 become higher as shown in FIG. 3. This crystal oscillator 1 is implemented as a voltage control type in which a voltage variable capacitance element 6 is inserted in an oscillation closed loop, and the oscillation frequency is controlled by a control voltage Vc.

The first selecting/amplifying unit 8 and the second selecting/amplifying unit 9 are arranged in parallel for the output from the crystal oscillator 1.

The first selecting/amplifying unit 8 is composed of a crystal filter 11 and an amplifier 12, and the second selecting/amplifying unit 9 is composed of an SAW filter 2 and an amplifier 3.

The crystal filter 11 of the first selecting/amplifying unit 8 is implemented by so-called an MCF (Monolithic Crystal Filter) which is configured by forming input/output electrodes on a crystal piece not shown, and uses acoustic coupling. This crystal filter 11 has a transmission characteristic (filter characteristic) that uses the fundamental component (155.52 MHz) within the oscillation output of the crystal oscillator 1 as a central frequency. Namely, the crystal filter 11 mainly selects a fundamental component, and makes the fundamental component pass through (this output is defined to be a first output).

The SAW filter 2 of the second selecting/amplifying unit 9 has a transmission characteristic that uses as a central frequency of the harmonic component (622.08 MHz), which becomes a quadruple-frequency wave, in the oscillation output of the crystal oscillator. Namely, the SAW filter 2 mainly selects a harmonic component which becomes a quadruple-frequency wave, and makes the harmonic component pass through (this output is defined to be a second output).

In the first selecting/amplifying unit 8 and the second selecting/amplifying unit 9, frequency components that are selected and output from the crystal filter 11 and the SAW filter 2 are amplified using a linear portion of the input/output characteristic of the broadband amplifiers 3 and 12.

The multiplexer 10 is arranged at a stage succeeding the first selecting/amplifying unit 8 and the second selecting/amplifying unit 9. The multiplexer 10 selects and outputs one of the first and the second output from the first selecting/amplifying unit 8 and the second selecting/amplifying unit 9 with a selection switching mechanism. With the selection switching mechanism, the first output is selected, for example, if a digital signal 1 (high level) is input to a selection terminal S, or the second output is selected if 0 (low level) is input, so that one of the high frequencies is output from an output terminal OUT. Here, the output terminal pair OUT (a, b) output complementary signals having opposite phases.

Additionally, in this preferred embodiment, if one of the first and the second outputs is selected with the selection switching mechanism, the other is not input to the multiplexer 10. For instance, if the first output is selected, the second output is not input to the multiplexer 10.

The configuration shown in FIG. 4 comprises a power supply box 13, which has a terminal connected to a power source Vcc and terminals connected to the power supplies of the amplifiers 3 and 12 within the first and the second selecting/amplifying units 8 and 9, and selectively supplies the power source Vcc to the side of the first selecting/amplifying unit 8 or the second selecting/amplifying unit 9 based on an input to the selection terminal S. An amplifier to be driven is switched in synchronization with the input of a digital signal 1 or 0 to the selection terminal S. By way of example, if 1 (high level) that selects the first output is input to the selection terminal S, the power supply box 13 connects the power source Vcc to the amplifier 12 within the first selecting/amplifying unit 8, and disconnects the power source from the amplifier 3 within the second selecting/amplifying unit 9. As a result, only the selected first output is input to the multiplexer 10, whereas the second output is not output from the second selecting/amplifying unit 9, and not input to the multiplexer 10. This is because the amplifier 3 is powered off.

With the high-frequency oscillator having the configuration shown in FIG. 4, a fundamental component, and a harmonic component which becomes a quadruple-frequency wave are selected in parallel by the crystal filter 11 and the SAW filter 2 from within the oscillation output in which the level of a harmonic component is made high relative to the fundamental component of the crystal oscillator 1, so that the first and the second outputs are extracted. After the outputs are respectively amplified, one of the first and the second outputs is selected with the selection switching mechanism of the multiplexer 10, and the selected output is defined to be a high frequency output. Accordingly, 2 high-frequency outputs can be obtained from one crystal oscillator.

Furthermore, in the example shown in FIG. 4, only one of the power supplies of the amplifier 12 within the first selecting/amplifying unit 8 and the amplifier 3 within the second selecting/amplifying unit 9 is connected in synchronization with an input to the selection terminal S of the selection switching mechanism of the multiplexer 10, and the other power supply is disconnected. To the multiplexer 10, only one of the outputs of the first and the second selecting/amplifying units 8 and 9, which corresponds to the input to the selection terminal S, is inputted, and the other output is blocked. As a result, an electric mutual interference between the multiplexer 10, the first selecting/amplifying unit 8 and the second selecting/amplifying unit 9 can be prevented, thereby further reducing phase noise.

In the above provided explanation, the high-frequency outputs from the high-frequency oscillator are assumed to be the fundamental component (155.52 MHz) of the crystal oscillator 1and the harmonic component (622.08 MHz). However, both of the 2 outputs may be harmonic components. In this case, the frequency of the fundamental component of the crystal oscillator 1 can be set to a low value. The thickness of the crystal piece is inversely proportional to the oscillation frequency, which facilitates the manufacturing of the crystal resonator 4. The essential point is that the first and the second outputs are arbitrary frequency components within the frequency spectrum of the oscillation output of the crystal oscillator 1. Note that, however, "the first" and "the second" here indicate not the ordinal numbers of one and two, but arbitrary ordinal numbers.

Additionally, the high-frequency outputs are assumed to be 2 frequencies 155.52 MHz and 622.08 MHz. However, the high-frequency outputs are not limited to these values, and 2 arbitrary frequency components within the frequency spectrum may be selected. However, since 155.52 MHz and 622.08 MHz conform to the international standard under present circumstances, a configuration for outputting these frequencies is preferable.

Furthermore, the first output (155.52 MHz) of the first selecting/amplifying unit is selected by using the MCF. The reason is that: if the SAW filter 2 is applied, the gaps between interdigital transducers, which are inversely proportional to the frequency, become wide, leading to a slight increase in the size of the filter. If this is ignored, the SAW filter 2 may be adopted. Furthermore, a filter having a function similar to the SAW filter 2 and the crystal filter 11 may be used instead.

Still further, with the selection switching mechanism, the power supplies of the amplifiers 3 and 12 within the first and the second selecting/amplifying units 8 and 9 are selected and switched according to a digital signal 0 or 1, which is input to the selection terminal S for switching the output of the multiplexer 10. However, the power supplies may be switched by another configuration. For example, an electronic switch is arranged on a power supply line to each of the amplifiers 3 and 12, and the outputs may be selected in synchronization with a digital signal input from the selection terminal S. In this case, the selection and switching in synchronization with an input signal can be configured arbitrarily.

Still further, the amplifiers 3 and 12 are respectively arranged for the crystal filter 11 and the SAW filter 2 within the first and the second selecting/amplifying units 8 and 9. However, the amplifiers 3 and 12 are not always required if the output levels of the filters 2 and 11 are sufficiently high.

Still further, the first output (155.52 MHz) being the fundamental component of the first selecting/amplifying unit is selected by the MCF. However, since the level of the fundamental component relative to a harmonic component is originally high, a configuration where the MCF is not arranged may be adopted according to the degree of distortion. With this configuration, the downsizing of the high-frequency oscillator can be accelerated.

Still further, for ease of explanation, FIG. 4 shows the configuration where the 2 selecting/amplifying units are arranged, and one of the 2 frequencies such as the fundamental component and the harmonic component of a quadruple-frequency wave is selected and output. However, this preferred embodiment is not limited to the configuration where one signal is selected and output from among the above described 2 frequency signals. A configuration where 3 or more selecting/amplifying units are arranged, and one or a plurality of signals are selected and output from among 3 or more signals of different frequencies, which are selected and amplified by the 3 or more selecting/amplifying units may be implemented.

Figure 5:
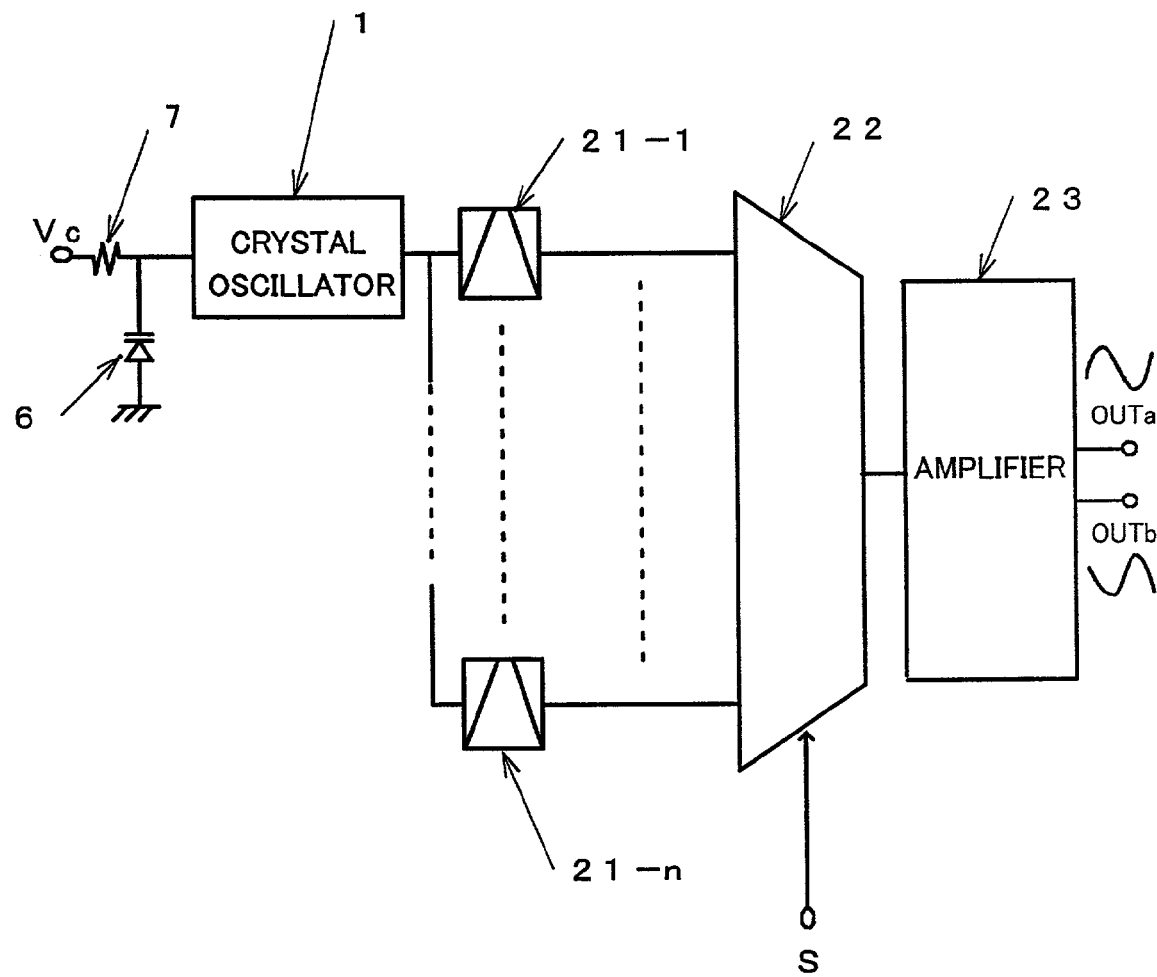
FIG. 5 is a circuit diagram exemplifying another configuration of the high-frequency oscillator according to the preferred embodiment.

FIG. 5 exemplifies another configuration of the high-frequency oscillator according to this preferred embodiment.

The high-frequency oscillator shown in this figure has a configuration where an amplifier 23 is arranged at the last stage. This oscillator comprises: a plurality of filters 21-1 through 21-$n$, each of which extracts a signal of a particular frequency from the output of a crystal oscillator 1; a multiplexer 22 selecting and outputting one signal from among the signals output from the plurality of filters 21-1 through 21-$n$ based on an input to the selection terminal S; and the amplifier 23 amplifying the output from the multiplexer 22.

In this configuration, even if the number of frequency signals to be output increases, only one amplifier 23 is required to be arranged although filters 21, the number of which corresponds to the number of frequency signals to be output, must be arranged. Accordingly, the circuitry scale, the capacity, the cost, etc. of the high-frequency oscillator can be suppressed even for a configuration where many frequencies are output.

When the configuration shown in FIG. 5 is implemented, an amplifier whose input impedance covers a broad range, and can amplify an input signal by making its output level constant even if the frequency of the input signal significantly vary must be used as the amplifier 23.

In the explanations provided above with reference to FIGS. 4 and 5, the filters respectively extract the fundamental component and the harmonic component from the oscillation output that the crystal oscillator 1 distorts and outputs, and the multiplexer 10 selects one of the components. However, the present invention is not limited to this implementation. Any different configuration may be fundamentally available so long as a plurality of frequency components within the frequency spectrum of the oscillation output of a crystal oscillator are output in parallel, and one or plurality of the components are selected.

Additionally, the high-frequency oscillators shown in FIGS. 4 and 5 implement complementary outputs. However, a single output terminal OUT may be arranged to implement one output. Furthermore, the crystal oscillator 1 may be a mere crystal oscillator, although it is implemented as a voltage control type in the above described preferred embodiments.

What is claimed is:

1. A high-frequency oscillator, comprising:
   a crystal oscillation unit producing a distorted oscillation output having a plurality of frequency components by making a center voltage of the distorted oscillation output higher than a center voltage of a power source voltage;
   a first filter unit allowing only a first of said frequency components to pass through said first filter unit, the first frequency component being one of a plurality of the frequency components in a frequency spectrum of the oscillation output;
   a second filter unit allowing only a second of said frequency components to pass through said second filter unit, the second frequency component being one of a plurality of the frequency components in the frequency spectrum of the oscillation output; and
   a multiplexer unit selecting a signal which passes through one of said first filter unit and said second filter unit, wherein the signal is an output of the high-frequency oscillator,
   wherein said first filter unit is a monolithic crystal filter, and said second filter unit is a surface acoustic wave filter.

2. The high-frequency oscillator according to claim 1, further comprising
   a unit that blocks an input of a non-selected signal, which is not selected and passes through one of said first filter unit and said second filter unit, to said multiplexer unit when said multiplexer unit selects the other signal which passes through one of said first filter unit and said second filter unit.

3. The high-frequency oscillator according to claim 1, wherein
   the first frequency component is a fundamental frequency component, and the second frequency component is a harmonic frequency component.

4. The high-frequency oscillator according to claim 1, wherein
   said second filter unit is connected to said crystal oscillation unit in parallel with said first filter unit.

5. The high-frequency oscillator according to claim 1, further comprising:
   a first amplifying unit amplifying a signal which passes through said first filter unit; and
   a second amplifying unit amplifying a signal which passes through said second filter unit, wherein
   said multiplexer unit selects a signal which is amplified by one of said first amplifying unit and said second amplifying unit.

6. The high-frequency oscillator according to claim 5, further comprising
   a power supply unit disconnecting a power source from said second amplifying unit when said multiplexer unit selects a signal which is amplified by said first amplifying unit, and disconnecting the power source from said first amplifying unit when said multiplexer unit selects a signal which is amplified by said second amplifying unit.

7. The high-frequency oscillator according to claim 1, wherein said multiplexer unit outputs complementary signals having opposite phases.

8. A high-frequency oscillator, comprising:
   a crystal oscillation unit distorting and outputting an oscillation output by making a center voltage of the distorted oscillation output higher than a center voltage of a power source voltage;
   a plurality of filter units each making one frequency component within a frequency spectrum of the oscillation output pass through, wherein one of said filter units is a monolithic crystal filter and another of said filter units is a surface acoustic wave filter; and
   a multiplexer unit selecting signals which pass through one or more plurality of filter units.

9. The high-frequency oscillator according to claim 8, further comprising:
   a unit that blocks an input of a non-selected signal, which said multiplexer unit does not select from among signals that pass through one of said plurality of filter units to said multiplexer unit, when said multiplexer unit selects the other one or more signals which pass through one of said plurality of filter units.

10. A high-frequency oscillator, comprising:
    means for outputting in parallel a plurality of frequency components within a frequency spectrum which includes a fundamental frequency component, from a monolithic crystal filter, and a harmonic component, from a surface acoustic wave filter, of an oscillation output from a crystal oscillator, the crystal oscillator producing a distorted oscillation output having a plurality of frequency components by making a center voltage of the distorted oscillation output higher than a center voltage of a power source voltage; and
    multiplexer means for selecting one or more frequency components from the plurality of frequency components.

11. A high-frequency oscillator, comprising:
    crystal oscillation means for producing a distorted oscillation output having a plurality of frequency components by making a center voltage of the distorted oscillation output higher than a center voltage of a power source voltage;
    first filter means for allowing only a first of said frequency components to pass through said first filter means, said first filter means consisting of a monolithic crystal filter, the first frequency component being one of frequency components of a frequency spectrum of the oscillation output;
    second filter means for allowing only a second of said second frequency components to pass through said second filter means, said second filter means consisting of a surface acoustic wave filter, the second frequency component being one of the frequency components of the frequency spectrum of the oscillation output; and
    multiplexer means for selecting a signal which passes through one of said first filter means and said second filter means, wherein the signal is an output of the high-frequency oscillator.

12. A high-frequency oscillator, comprising:

crystal oscillation means for producing a distorted oscillation output having a plurality of frequency components by making a center voltage of the distorted oscillation output higher than a center voltage of a power source voltage;

a plurality of filter means each allowing only one frequency component within a frequency spectrum of the oscillation output to pass through said filter means, said plurality of filter means including a monolithic crystal filter and a surface acoustic wave filter; and multiplexer means for selecting signals which pass through one or more said plurality of filter means, wherein the signal is an output of the high-frequency oscillator.

13. A high-frequency oscillation method, comprising:

outputting in parallel a plurality of frequency components within a frequency spectrum of an oscillation output from a crystal oscillator by making a center voltage of the distorted oscillation output higher than a center voltage of a power source voltage;

allowing only a first of said frequency components to pass through a monolithic crystal filter;

allowing only a second of said frequency components to pass through a surface acoustic wave filter; and selecting and outputting a frequency components from among the first and second frequency components that have passed through either the monolithic crystal filter or the surface acoustic wave filter.

* * * * *

UNITED STATES PATENT AND TRADEMARK OFFICE
CERTIFICATE OF CORRECTION

PATENT NO. : 7,019,596 B2 Page 1 of 1
APPLICATION NO. : 10/101008
DATED : March 28, 2006
INVENTOR(S) : Takeo Oita et al.

It is certified that error appears in the above-identified patent and that said Letters Patent is hereby corrected as shown below:

Column 5,
Line 43, delete "oscillator land" and insert -- oscillator 1 and --.

Column 10,
Line 11, delete "components" and insert -- component --.

Signed and Sealed this

Twenty-seventh Day of June, 2006

JON W. DUDAS
*Director of the United States Patent and Trademark Office*